United States Patent [19]

Oberhauser et al.

[11] Patent Number: 5,373,537

[45] Date of Patent: Dec. 13, 1994

[54] METHOD AND APPARATUS FOR THE SYNCHRONIZATION OF A CLOCK MEANS OF A TELECOMMUNICATION SWITCHING SYSTEM

[75] Inventors: Walter Oberhauser, Wolfratshausen; Reinhold Hoffmann, Utting am Ammersee, both of Germany

[73] Assignee: Siemens Aktiengesellschaft, Munich, Germany

[21] Appl. No.: 936,629

[22] Filed: Aug. 28, 1992

[30] Foreign Application Priority Data

Sep. 2, 1991 [EP] European Pat. Off. ........ 91114771.8
Sep. 18, 1991 [DE] Germany .............. 4131063

[51] Int. Cl.⁵ .................. H04L 7/00; G06F 15/20
[52] U.S. Cl. .................... 375/108; 375/118; 371/5.4; 371/47.1; 327/141; 327/144; 327/291
[58] Field of Search ............ 375/108, 107, 118; 370/100.1, 103; 307/269; 340/825.2; 371/42, 47.1, 5.4, 61, 8.2; 328/72

[56] References Cited

U.S. PATENT DOCUMENTS

| 4,409,684 | 10/1983 | Pooch et al. . |
| 4,538,272 | 8/1985 | Edwards et al. ........... 375/108 |
| 4,651,103 | 3/1987 | Grimes ................. 375/108 |
| 4,779,008 | 10/1988 | Kessels . |
| 5,036,528 | 7/1991 | Costantino et al. ......... 375/119 |
| 5,136,617 | 8/1992 | Stenard ................ 375/108 |
| 5,153,824 | 10/1992 | Lalanne et al. .......... 364/569 |
| 5,260,979 | 11/1993 | Parker et al. ........... 375/108 |

FOREIGN PATENT DOCUMENTS

| 0084002 | 7/1983 | European Pat. Off. . |
| 0391144 | 10/1990 | European Pat. Off. . |
| 0423663 | 4/1991 | European Pat. Off. . |
| 3032296 | 6/1981 | Germany . |
| 3131406 | 3/1983 | Germany . |
| 3809089 | 9/1989 | Germany . |
| 62-268232 | 5/1989 | Japan . |
| 62-269736 | 5/1989 | Japan . |
| 63-57253 | 9/1989 | Japan . |
| WO87/00369 | 1/1987 | WIPO . |

OTHER PUBLICATIONS

R. Schauer, "External Clock Synchronization Plans for the 6TD 3 EAX Digital Toll/Tandem", Jul. 1979, IEEE Transactions on Communications, vol. 27.
"Lehrbuch Der Fernmeldetechnik" by Bergmann, vol. 1, 5th edition, Berlin (1986), p. 485.
"Master-slave synchronization techniques" by Katsuya Okimi et al, IEEE Communications Magazine, vol. 19, No. 3, May 1981, pp. 12–21.

Primary Examiner—Stephen Chin
Assistant Examiner—Timothy J. May
Attorney, Agent, or Firm—Hill, Steadman & Simpson

[57] ABSTRACT

Method and apparatus for synchronizing a clock of a telecommunication switching system. The clock of the telecommunication switching system is supplied, at least at times, with reference clock signals from a plurality of external reference clock sources. Every external reference clock source has a predetermined priority allocated to it. The supplied reference clock signals are checked for clock errors to which individual errors are allocated. For synchronization, the clock accepts an external reference clock signal dependent on the priorities allocated to the reference clock sources and dependent on the clock-error-associated error values. In an initialization, initial error values are allocated to the reference clock sources. In a re-initialization of the system, the synchronization procedure is continued from the current error values that are present at the time of the system outage.

14 Claims, 2 Drawing Sheets

FIG 3a

| ERROR TYPE | INCREMENT ERROR COUNTER |
|---|---|
| Clock not connectable | 20000 |
| Clock not recognized | 32000 |
| Control not possible | 32000 |
| Does not become synchronous | 32000 |
| Bit slip | 121 |
| Bit error rate $>10^{-6}$ | 61 |
| Bit error rate $>10^{-3}$ | 1001 |
| Lost frame | 11 |
| No Signal | 11 |

FIG 3b

| | PRIORITY | ERROR |
|---|---|---|
| $f_{RA}$ | 90 | 45311 |
| $f_{RB}$ | 89 | 41708 |
| ⋮ | ⋮ | ⋮ |
| $f_{RN}$ | 85 | 46795 |

METHOD AND APPARATUS FOR THE SYNCHRONIZATION OF A CLOCK MEANS OF A TELECOMMUNICATION SWITCHING SYSTEM

BACKGROUND OF THE INVENTION

The present invention is directed to a method for synchronizing a clock means of a telecommunication switching system to which is supplied at least at times, reference clock signals from a plurality of external reference clock sources.

In synchronous digital telecommunication networks, central clock means of individual digital exchanges are hierarchically synchronized according to the master/slave principle. A single, frequency-defining clock generator (master clock) is thereby provided for the entire network and all other clock generators are synchronized to its clock frequency. Particularly for larger networks, however, this method has the risk that a fault in the central clock generator will cause the entire network to fail. In order to reduce the extent of the failure range, redundant clock supply lines are provided in this method and relatively exact, local clock generators are also utilized so that operation can be maintained in case of a malfunction at least with what is still an acceptable slippage rate (Bergmann, Lehrbuch der Fernmeldetechnik, Vol. 1, 5th Edition, Berlin 1986, page 485).

European Patent Application 90105379.3 discloses a method for synchronizing a clock means of a clocked electrical system. During normal operation, the telecommunication exchange is synchronized by an external reference frequency and, given a long outage of the external reference frequency, a normal internal frequency for the system is activated which is spatially separated from the clock means. When more than one external reference frequency is available, the normal internal frequency for the system is only activated when all external reference frequencies have failed. Given outage of a currently utilized external reference frequency, a switch to a different external reference frequency is undertaken. How this switching occurs when a plurality of further, external reference frequencies are available given outage of the currently connected external reference frequency thereby remains unanswered.

SUMMARY OF THE INVENTION

It is an object of the present invention to provide a method for synchronizing a clock means of a digital telecommunication switching system which, given supply of a plurality of external reference frequencies, meets the requirements for substantial synchronization.

This object is achieved by a method having the steps of: every external reference clock source has a prescribed priority allocated to it; a respective initial error value is allocated to each of the reference clock signals supplied to the clock means from the reference clock sources in an initialization of the telecommunication switching system; every reference clock signal is checked for clock errors that are individually associated to the reference clock signals during ongoing operation of the telecommunication switching system, error values individually associated to clock errors being allocated to these clock errors; for synchronization, the clock means accepts one of the reference clock signals dependent on the priorities allocated to the reference clock sources and dependent on current error values formed from the initial error values and the clock-error-associated error values; and the clock means continues the synchronization procedure from the current error values present at the time of a system outage given a re-initialization of the telecommunication switching system that occurs after the outage of the telecommunication switching system.

An important aspect of the present invention is that the selection of one of a plurality of external reference clock sources or reference clock signals occurs according to two different criteria; a priority dependent on the predictable quality of the reference clock source or of the corresponding transmission link and on the appearance of errors during ongoing operations. The reference clock source which is respectively the best at the moment can thus be employed for the synchronization of the clock means. At the same time, one can proceed differently in the case of an initialization of the telecommunication switching system and in the case of a re-initialization: whereas prescribed, particularly identical error values are allocated to the reference clock sources or to the reference clock signals at an initialization of the system, and the synchronization procedure is continued in a re-initialization of the system based on the error values at the time of the system outage. After an initialization, the synchronization method of the present invention is defined by the prescribed priorities, whereby the synchronization after an initialization can (dependent on the errors individually associated to the reference clock signals) take a longer time span until the desired long-term stability is achieved. In a re-initialization, by contrast, the time span required for realizing the long-term stability can be considerably shortened to, for example, a few seconds when, following a system outage wherein the central clock means can still maintain the reference frequency, that was present at the time of the outage, over a certain time span due to its substantially stable oscillator. The re-initialization of the malfunctioning system part occurs during this time span. The internal frequency then still sufficiently coincides with the external reference clock signal such that a synchronization procedure as in an initialization of the system is not required.

It is provided in another advantageous embodiment of the present invention that the synchronization is begun anew from the initial error value given a re-initialization of the telecommunication switching system that occurs after the expiration of a prescribed time unit following the system outage. Thus, a modified error behavior of the reference clock sources or of the transmission links can be appropriately taken into consideration.

It is provided in another advantageous embodiment of the present invention that the clock means accepts the reference clock signal with the lower, clock-error-associated, current error value for its synchronization after the initialization and after the re-initialization given the same priorities of the reference clock sources. The clock means accepts the reference clock signal of the reference clock source having the highest priority given different priorities of the reference clock sources insofar as the reference clock signal supplied from this reference clock source does not exceed a prescribed, upper, first error limit value. The clock means accepts the reference clock signal of the reference clock source of the next-highest priority when this error limit value is upwardly exceeded, insofar as the reference clock signal supplied from the reference clock source having the next-highest priority has a lower, current error value than the reference clock signal of the reference clock source having the highest priority.

The reference clock signal of the highest priority thus remains the determining factor for the synchronization of the clock means. This is true even if the current error value of the reference clock signal having the highest priority is higher than the current error value of the reference clock signal of the next priority, insofar as the reference clock signal of the highest priority does not exceed the prescribed, first error limit value. The number of reference clock changes to be undertaken is reduced in this way both following an initialization as well as following a re-initialization. Synchronization procedures that could require several minutes dependent on the structure of the appertaining telecommunication switching system are thus eliminated, so that the long-term stability of the system is improved by the embodiment of the present invention.

These advantages also result when the clock means (for the synchronization thereof following the initialization or following the re-initialization of the telecommunication switching system and given identical or different priorities of the reference clock sources) also retains the reference clock signal output by the reference clock source activated at the moment when the current error value of this reference clock signal lies below a lower, second error limit value and the current error value of the other reference clock signal or signals has or have an identical or lower current value.

The affect of errors that chronologically lie in the past is reduced in that the error values that are allocated to the reference clock signals supplied to the clock means are deincremented by a prescribed value after the expiration of prescribed time units, excluding potential down times.

In a further method of the present invention and upon re-initialization of the telecommunication switching system, circuits of assemblies that supply reference clocks are successively placed in operation. A check is then undertaken at every initialization of a circuit to determine if this set had an external reference clock line through-connected to the central clock means at the time of the system outage. Following a positive result of this check, the external reference clock line is through-connected to the central clock means.

In an apparatus for the implementation of the method of the present invention the clock means has a means for checking the supplied reference clock signals for current clock errors and for evaluating the current clock errors, a table memory for accepting the error values and a control to which is allocated a program for the implementation of the method. The control and/or the table memory can be redundantly provided.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

FIGS. 3a and 3b are examples of the contents of a table memory in a clock means according to FIG. 1 or FIG. 2.

DESCRIPTION OF THE PREFERRED EMBODIMENT

Figure 1:
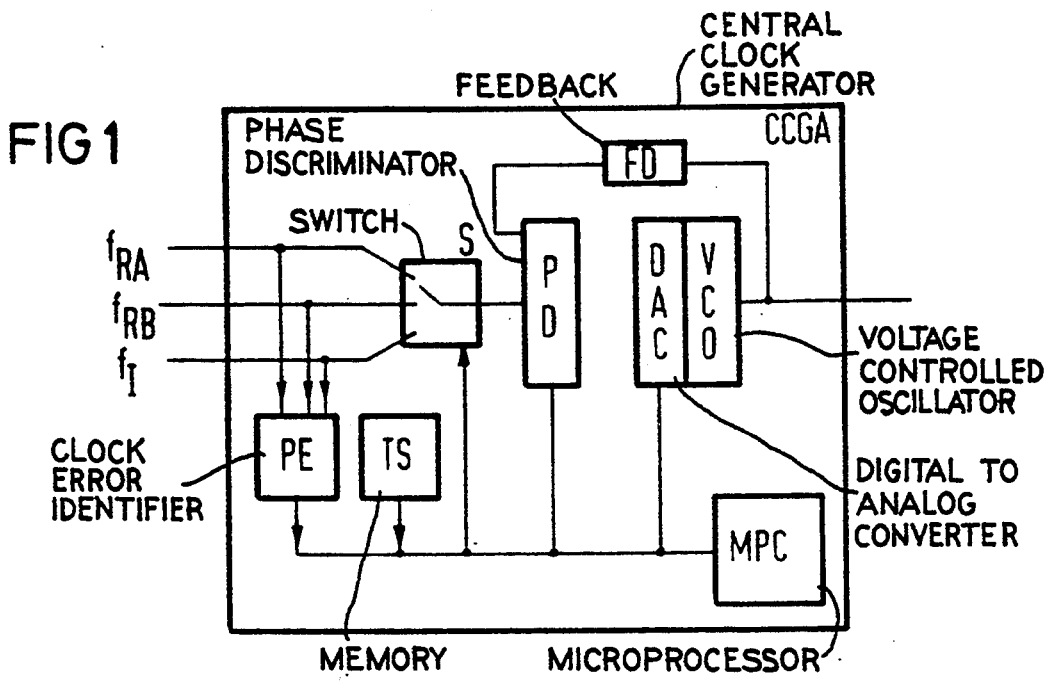
FIG. 1 is a block circuit diagram of a clock means.

The synchronization method shall now be set forth with reference to the clock means shown in FIG. 1. The clock means shown in FIG. 1, particularly a clock means of a telecommunication switching system has a central clock generator CCGA to which, for example, two external reference frequencies $f_{RA}$ $f_{RB}$ are supplied from a first reference clock source A and from a second external reference clock source B that are not shown in FIG. 1. In addition, an internal reference frequency $f_I$ that, for example, is supplied from an internal clock source of the system can be supplied to the central clock generator CCGA.

The inputs of the clock generator CCGA can be switched by a switch S controlled by a microprocessor MPC. The inputs of the clock generator carrying the external reference clock signals are connected to a means PE that shall be set forth later and that checks the supplied reference clock signals for clock errors and assigns individual error values to the clock errors. These error values are individually administered in the table memory TS for every external reference clock signal. In addition, the priority values for those external reference clock sources that supply the corresponding reference clock signals to the central clock generator CCGA can be stored in the table memory TS. In the present instance, the priority value of the external reference clock source A, for example, is 90 and the priority value of the external reference clock source B is 89.

All reference clock signals have an initial error value assigned to them in an initialization of the telecommunication switching system. In particular, the same initial error value of, for example, 16000 is assigned to all reference clock signals in an initialization. The initial error value, in particular, is identical to a lower, second error limit value that shall be set forth below.

The microprocessor MPC controls the control of the phase-locked loop that is further composed of a phase discriminator PD, of a digital-to-analog converter DAC, of a voltage-controlled oscillator VCO and of a feedback FD that returns the output frequency of the voltage-controlled oscillator VCO to an input of the phase discriminator PD.

The microprocessor MPC controls the switch S dependent, first, on the clock errors identified by the means PE individually associated to the reference clock signals or on the error values assigned to the clock errors and, second, dependent on the prescribed priority of the external reference clock sources A and B. The priority of the external reference clock sources is defined according to their clock quality and the quality of the transmission link from the respective reference clock source to the central clock generator under consideration. ISDN connections are assigned relatively high priorities. In network systems, the respective priority is dependent on the network to which the trunk circuit or tie line leading to the clock means is connected and is also dependent on the topology of the telecommunication switching system.

In a known manner, the means PE identifies the errors listed in the table depicted in FIG. 3a. These errors are "clock not connectable" "bit slip" "bit error rate $>10^{-6}$", "bit error rate $>10^{-3}$", "lost frame", "no signal". The bit error rates are identified by means of the CRC4 procedure according to CCITT G.704. The microprocessor MPC recognizes the errors of "clock not recognized", "control not possible" and "does not become synchronous".

The microprocessor MPC particularly controls the switch S in such a way that the clock means accepts the reference clock signal $f_{RA}$ of the reference clock source A having the highest priority given different priorities (in the present case: the priority of the reference clock source A is equal to 90, the priority of the reference clock source B is equal to 89), insofar as the reference clock signal $f_{RA}$ supplied from this reference clock source A does not exceed an "upper", first error limit value When this error limit value is upwardly exceeded (this, for example, is set at a value of 42,000), the switch S is controlled such that the clock means accepts the reference clock signal $f_{RB}$ of the reference clock source B having the following priority, insofar as the reference clock signal $f_{RB}$ supplied by this reference clock source B has a lower error value than the reference clock signal $f_{RA}$ of the reference clock source M having the highest priority.

When the reference clock sources have the same priority, the microprocessor switches the switch S such that the clock means accepts the reference clock signal having the lowest clock-error-associated error value. The method of the present invention can be applied both to clock means to which reference clock signals are exclusively supplied from reference clock sources of identical priority and to clock means whose reference clock signals are supplied from a plurality of reference clock sources, whereby only clock sources in a sub-set of the reference clock sources have the same priority.

When a reference clock signal connected for synchronization of the clock means lies below a lower, second error limit value of, for example, 16000 and, thus, has a relatively low, current error value, it can be provided that the current adjacent reference clock signal is also retained when the current error value of a non-accepted reference clock signal or the current error values of a plurality of non-accepted reference clock signals have an identical or lower current error value than the current error value of the accepted reference clock signal. The priorities of the reference clock sources that supply the reference clock signals accepted or not accepted by the clock means have no influence. The number of changes to be made of reference clock is reduced in this way, as already mentioned.

The above-described synchronization procedures are implemented after an initial error value is allocated to every reference clock signal supplied to the clock means at the system input by the reference clock sources.

Given a re-initialization of the system following a system outage, the synchronization method is continued from the current error values present at the time of the system outage. To this end, the table memory TS is, for example, a non-volatile memory. However, the current error values stored in the table memory TS can also be protected against erasure given a system outage in another way, as shall yet be set forth. The current error values result by addition of the initial error values and the clock-error-associated values formed during ongoing operations. However, the current error values can also be deincremented. In this case the microprocessor MPC or a separate control of the means PE reduces the current error values formed for the reference clock signals by a prescribed value, for example by 5% per hour, after the expiration of prescribed time units. A time-metering is interrupted given a system outage and is continued upon a re-initialization. The time-metering is also aborted or interrupted when a reference clock signal originally supplied to the system fails. The influence of errors that have occurred is reduced with this time-dependent deincrementation of the error values after the expiration of prescribed time spans and the influence of the prescribed reference clock source priorities is enhanced.

Figure 2:
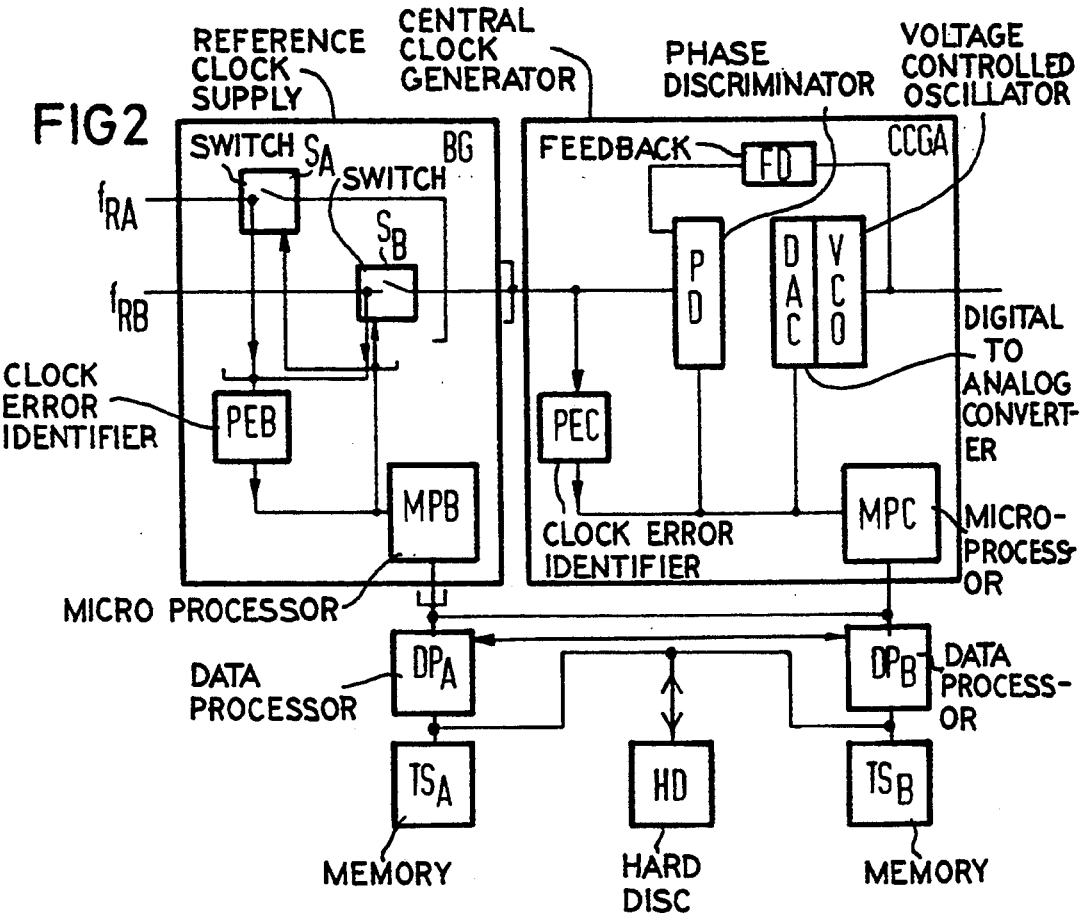
FIG. 2 is a block circuit diagram of a clock means to which a plurality of assemblies supplying reference clocks are connected in a telecommunication switching system.

FIG. 2 shows a central clock means to which a plurality of assemblies BG supplying reference clocks are connected in a telecommunication switching system. Every assembly BG has an assembly-associated processor MPB that implements the control procedures to be undertaken from the respective assembly in combination with a central data processor DP and the processor MPC of the central clock generator. Every assembly, for example, can comprise trunk lines $S_A$ or tie trunks $S_B$. The reference clock signals, for example $f_{RA}$ and $f_{RB}$, can be respectively connected to the central clock generator CCGA via a switch of the circuits $S_A$ or $S_B$. Clock errors are respectively identified by a unit PEB in the assemblies and by a unit PEC in the central clock generator. The devices PEB and PEC correspond to the means PE shown in FIG. 1.

In the present exemplary embodiment, a table memory $TS_A$ is allocated to the central data processor $DP_A$. The table memory $TS_A$ and the central data processor $DP_A$ are redundantly implemented, so that a further table memory $TS_B$ and a further central data processor $DP_B$ are provided. Via a cross channel which connects them, the two data processors $DP_A$, $DP_B$ recognize an outage of their partner processor. When a standby processor recognizes the outage of the partner processor that had been active up to this moment, then the former processor starts a run-up. When modifications of the content of the table memory that is allocated to the active data processor were previously entered into the table memory that is allocated to the standby data processor, then the data processor which has now been activated can immediately access the current status of the data in its allocated table memory and connect the current reference clock signal.

The two table memories $TS_A$ and $TS_B$ are connected to a hard disc HD. It can be provided that a program allocated to the momentarily active data processor $DP_A$ or $DP_B$ causes the content of the table memory $TS_A$ or of the table memory $TS_B$ (which is identical to the content of the table memory $TS_A$ in the ideal case) to be written into the non-volatile hard disc HD. For example, this can occur at regular intervals or given the occurrence of prescribed events such as, for example, a change of reference clock signal, so that the data originally written into the memories $TS_A$ or $TS_B$ are preserved given a system outage. Upon re-initialization of the system, the content of the memory HD is written into the table memories $TS_A$ and $TS_B$. Thus, the synchronization following a system re-initialization on the basis of the data that was written in the table memories $TS_A$ or $TS_B$ at the time of the system outage. The aforementioned, relatively long synchronization procedures, that can last on the order of magnitude of minutes or seconds until a relatively stable condition is achieved, are thus eliminated.

As an alternative to writing the data into the memory HD, it can also be provided that the table memory or table memories $TS_A$ and $TS_B$ are fashioned as nonvolatile memories.

Selected error types and error values allocated to them are listed in FIG. 3a. The error type "clock not connectable" thereby denotes that the reference clock signal cannot be connected because of a malfunction at the appertaining input. The microprocessor MPC or MPB recognizes the error type "clock not recognized" when no reference clock signal is at the momentarily connected input. Further, the microprocessor MPC connected to the internal control loop recognizes the error type "control not possible". This error type is present, for example, when the internal control loop (PD, DAC, VCO, FD) of the central clock generator CCGA is malfunctioning or is operating to only a limited extent. Further, it recognizes the error type "does not become synchronous" when, despite control times that are adequately long in and of themselves, the required synchronism with the connected reference clock signal is not successfully provided.

As set forth with reference to FIGS. 1 and 2, the means PE or PEB and PEC as well as MPC, MPB identifies the appearance of errors while accompanying operations and assigns prescribed error values that are listed in FIG. 3a to the errors. It can thereby be provided that the error counter (see FIG. 3b) stored in the table memory TS (or, respectively, $TS_A$, $TS_B$), that is individually associated to the reference clock signals is pre-initialized with an error value of 16,000 at the beginning of operations. As a result the newly formed value can assume lower, positive values than the initial value in the inventively provided deincrementation of the current error value after the expiration of given time units by, for example, 5% per hour. The value of 0 represents an error-free, ideal condition.

FIG. 3b shows the table stored in the table memory TS (or, respectively, $TS_A$, $TS_B$). The prescribed priority as well as the current error count are stored in this table for every reference clock source. In the illustrated example, the current error value of the reference clock source A having the higher priority (90) is 45,311, whereas the current error value of the reference clock source B having the lower priority (89) is to 41,708. When an upper error limit value of 42,000 is defined, the microprocessor MPC switches the switch S from the input that carries the reference clock signal $f_{RA}$ to the input that carries the reference clock signal $f_{RB}$. When clock errors are now recognized in the reference clock signal $f_{RB}$ that raise the error value to a new error value of, for example, 46,000 which lies above what is then the current error value of $f_{RA}=45,311$, then the microprocessor MPC again switches the switch S to the input that carries the reference clock signal $f_{RA}$.

As already set forth, a respective initial value, for example 16,000, is allocated to every reference clock signal $f_{RA}$, $f_{RB}$, ... $f_{RN}$ supplied to the clock means from the reference clock sources in an initialization of the telecommunication switching system according to the method of the present invention. During ongoing operations of the telecommunication switching system, every reference clock signal $f_{RA}$, $f_{RB}$ ... $f_{RN}$ is checked for clock errors individually associated to the reference clock signals (FIG. 3a), to which clock-associated error values are allocated. For its synchronization, the clock means accepts one of the reference clock signals dependent on the priorities allocated to the reference clock sources and dependent on current error values formed from the initial error values and the clock-error-associated error values. Given a re-initialization of the system following a system outage, the synchronization procedure is continued proceeding from the current error value present at the time of the system outage. It can thereby be provided that the synchronization is newly begun proceeding from the initial error values given a re-initialization of the system that occurs after expiration of a prescribed time unit following the system outage.

Further, the synchronization can occur in such a way, following the initialization and following the re-initialization, that the clock means accepts the reference clock signal having the lowest clock-error-associated error value given identical priorities of the reference clock sources. Given different priorities of the reference clock sources, the clock means accepts the reference clock signal of the reference clock source having the highest priority, insofar as the reference clock signal supplied by this reference clock source does not exceed a prescribed, upper error limit value, for example 42,000. Given an upward transgression of this upper, first error limit value, the clock means accepts the reference clock signal of a reference clock source of lower priority, insofar as the reference clock signal supplied from this reference clock source has a lower current error value than the reference clock signal of the reference clock source having the highest priority.

Following the initialization or following the re-initialization of the system, the clock means retains the reference clock signal output by the momentarily active reference clock source given identical or different priorities of the reference clock sources. This is true even when the error value of this reference clock signal lies below a lower, second error limit value of, for example, 16,000 and the current error value of the other reference clock signal or reference clock signals has or have an identical or lower current value.

The telecommunication system can be fashioned in such a way that, upon re-initialization of the system, the circuits SE, SB of assemblies BG that supply reference clocks are individually placed in operation in succession. At very initialization of a circuit, a check is thereby carried out on the basis of data stored in the system as to whether this circuit had an external reference clock line through-connected to the central clock means CCGA at the time of the system outage (at the system inputs shown in FIG. 1 and in FIG. 2 which are referenced $f_{RA}$ and $f_{RB}$). When this check yields a positive result, i.e. when the circuit that has just been re-initialized had an external reference clock line through-connected at the time of the system outage, then this external reference clock line is again through-connected to the central clock means CCGA. The through-connection of the external reference clock line to the central clock means can thus occur at a time at which other circuits of the telecommunication switching system are again placed in operation. Dependent on the system size, a time-saving results is the order of magnitude of minutes. After this connection of the external reference clock line in the re-initialization of an individual circuit, the central clock means, particularly the microprocessor MPC, checks (as set forth above) whether the error cases of "clock not recognized", "control not possible", and "does not become synchronous" are present.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. A method for synchronizing a clock means of a telecommunication switching system to which reference clock signals from a plurality of external reference clock sources are supplied, comprising the steps of: allocating a respective priority from a plurality of priorities to every external reference clock source; allocating a respective initial error value to each of the reference clock signals supplied to the clock means from the reference clock sources during an initialization of the telecommunication switching system; detecting clock errors for every reference clock signal during an ongoing operation of the telecommunication switching system, respectively allocating an error value to each of said clock errors that are detected; respectively accumulating the error values for the reference clock signals; forming respective current error values from the initial error values and the respective accumulated error values of the detected clock errors for respective reference clock signals; allocating a respective current error value to each of the reference clock signals; accepting one of the reference clock signals for synchronization of the clock means dependent on the priorities allocated to the reference clock sources and dependent on the current error values; continuing the synchronization of the clock means using as the initial error values, said current error values that are present at a time of a system outage given a re-initialization of the telecommunication switching system that occurs after said outage of the telecommunication switching system.

2. The method according to claim 1, wherein synchronization is re-started from the initial error values given a re-initialization of the telecommunication switching system that occurs after expiration of a time period following the system outage.

3. The method according to claim 1, wherein the clock means accepts a reference clock signal from a reference clock source of the plurality of reference clock sources having a lowest current error value for synchronization of the clock means following initialization and following re-initialization given identical priorities of the reference clock sources; and wherein the clock means accepts a reference clock signal of a reference clock source having a highest priority given different priorities of the reference clock sources, insofar as the current error value of the reference clock signal supplied from said reference clock source having a highest priority does not exceed a prescribed, upper first error limit value; and wherein, given a current error value that exceeds said upper first error limit value, the clock means accepts a reference clock signal of a reference clock source of a next lower priority, when the reference clock signal supplied by said reference clock source of a next lower priority has a current error value lower than a current error value of the reference clock signal of the reference clock source having the highest priority.

4. The method according to claim 1, wherein the clock means uses one of the reference clock signals as a current reference clock signal for synchronization following initialization or following re-initialization of the telecommunication switching system, and wherein, the reference clock sources of the reference clock signals having identical or different priorities, a different reference clock signal is not accepted even when the current error value of said momentarily accepted reference clock signal is below a lower second error limit value and the current error value of at least one different reference clock signal is below or equal to the current error value of said momentarily accepted reference clock signal.

5. The method according to claim 1, wherein the current error values, that are allocated to the reference clock signals supplied to the clock means, are decremented by a predetermined value after expiration of at least one predetermined time unit.

6. The method according to claim 1, wherein the telecommunication switching system has groups of circuit boards, each group of circuit boards having a respective reference clock source, and wherein upon re-initialization of the telecommunication switching system, said groups of circuit boards are successively placed in operation; wherein a check is undertaken at every initialization of a respective group of circuit boards to determine whether the respective group of circuit boards had a reference clock source connected to the clock means at a time of the system outage; and wherein, when it has been determined that a reference clock source was connected to the respective group of circuit boards, the reference clock source is connected to the clock means.

7. An apparatus for implementing a method for synchronizing a clock means of a telecommunication switching system to which reference clock signals from a plurality of external reference clock sources are supplied, comprising: means for allocating a respective priority to every external reference clock source; means for allocating a respective initial error value to each of the reference clock signals supplied to the clock means from the reference clock sources during an initialization of the telecommunication switching system; means for detecting clock errors for every reference clock signal during an ongoing operation of the telecommunication switching system; means for respectively allocating an error value to each of said clock errors that are detected; means for respectively accumulating the error values for the reference clock signals; means for forming respective current error values from the initial respective accumulated error values and the error values of the detected clock errors for respective reference clock signals; means for allocating a respective current error value to each of the reference clock signals; means for storing the respective current error values of the reference clock sources; means for accepting one of the reference clock signals for the clock means for synchronization of the clock means dependent on the priorities allocated to the reference clock sources and dependent on the current error values; and means for continuing synchronization of the clock means using as the initial error values the stored current error values present at a time of a system outage given a re-initialization of the telecommunication switching system that occurs after said outage of the telecommunication switching system.

8. The apparatus according to claim 7, wherein at least the means for accepting one of the reference clocks signals and the means for continuing synchronization of the clock means forms a means for controlling, and wherein at least one of the means for controlling and the means for storing is redundantly provided.

9. The apparatus according to claim 7, wherein respective priorities that are allocated to the reference clock sources are stored in the means for storing.

10. A method for synchronizing a clock means of a telecommunication switching system to which reference clock signals from a plurality of external reference clock sources are supplied, comprising the steps of:
   a) allocating a respective priority from a plurality of priorities to every external reference clock source;
   b) allocating a respective initial error value to each of the reference clock signals supplied to the clock means from the reference clock sources during an initialization of the telecommunication switching system;
   c) individually detecting clock errors for every reference clock signal during an ongoing operation of the telecommunication switching system, and respectively allocating an error value to each of said clock errors that are detected;
   d) forming respective current error values from the initial error values and the error values of the clock errors for respective reference clock signals, and allocating a respective current error value to each of the reference clock signals;
   e) using one of the reference clock signals for synchronization of the clock means dependent on the priorities allocated to the reference clock sources and dependent on the current error values;
   f) using the current error values present at a time of a system outage for initial error values, provided that the telecommunication switching system is re-initialized within a predetermined time period after said outage of the telecommunication switching system;
   g) using the initial error values, given a re-initialization of the telecommunication switching system that occurs after expiration of the predetermined time period; and
   h) returning to step c).

11. The method according to claim 10, wherein the clock means accepts a reference clock signal from a reference clock source of the plurality of reference clock sources having a lowest current error value for synchronization of the clock means following initialization and following re-initialization given identical priorities of the reference clock sources; and wherein the clock means accepts a reference clock signal of a reference clock source having a highest priority given different priorities of the reference clock sources, insofar as the current error values of the reference clock signal supplied from said reference clock source having a highest priority does not exceed a prescribed, upper first error limit value; and wherein, given a current error value that exceeds said upper first error limit value, the clock means accepts a reference clock signal of a reference clock source of a next lower priority, when the reference clock signal supplied by said reference clock source of a next lower priority has a current error value lower than a current error value of the reference clock signal of the reference clock source having the highest priority.

12. The method according to claim 10, wherein the clock means uses one of the reference clock signals as a current reference clock signal for synchronization following initialization or following re-initialization of the telecommunication switching system, and wherein, the reference clock sources of the reference clock signals having identical or different priorities, a different reference clock signal is not accepted even when the current error value of said momentarily accepted reference clock signal is below a lower second error limit value and the current error value of at least one different reference clock signal is below or equal to the current error value of said momentarily accepted reference clock signal.

13. The method according to claim 10, wherein the current error values, that are allocated to the reference clock signals supplied to the clock means, are decremented by a predetermined value after expiration of at least one predetermined time unit.

14. The method according to claim 10, wherein the telecommunication switching system has groups of circuit boards, each group of circuit boards having a respective reference clock source, and wherein upon re-initialization of the telecommunication switching system, said groups of circuit boards are successively placed in operation; wherein a check is undertaken at every initialization of a respective group of circuit boards to determine whether the respective group of circuit boards had a reference clock source connected to the clock means at a time of the system outage; and wherein, when it has been determined that a reference clock source was connected to the respective group of circuit boards, the reference clock source is connected to the clock means.

* * * * *